United States Patent [19]

Landis et al.

[11] Patent Number: 4,963,752

[45] Date of Patent: Oct. 16, 1990

[54] METHOD FOR DETECTING MISSING CIRCUIT BOARD COMPONENTS

[75] Inventors: William R. Landis, Bloomington; Peter Bradford, Maple Grove, both of Minn.

[73] Assignee: Honeywell Inc., Minneapolis, Minn.

[21] Appl. No.: 292,487

[22] Filed: Dec. 30, 1988

[51] Int. Cl.⁵ .......................... G07C 3/14; G01J 1/38; G01J 5/54

[52] U.S. Cl. .................. 250/459.1; 250/302; 250/461.1

[58] Field of Search ................... 250/302, 459.1, 461.1

[56] References Cited

U.S. PATENT DOCUMENTS

| | | | |
|---|---|---|---|
| 3,522,432 | 8/1979 | Ortlieb | 250/461.1 X |
| 3,839,639 | 10/1974 | Hughes | 250/461.1 X |
| 4,061,922 | 12/1977 | Last | 250/461.1 |
| 4,152,723 | 5/1979 | McMahon et al. | 250/458.1 X |
| 4,237,379 | 12/1980 | Deckert et al. | 250/461.1 X |
| 4,538,909 | 9/1985 | Bible et al. | 356/237 |
| 4,549,206 | 10/1985 | Suzuki et al. | 358/106 |
| 4,560,273 | 12/1985 | Ando et al. | 356/237 |
| 4,621,193 | 11/1986 | Van Hoye | 250/459.1 X |
| 4,697,923 | 10/1987 | Jones et al. | 356/239 |

FOREIGN PATENT DOCUMENTS 56-46543 4/1981 Japan ................ 250/461.1

*Primary Examiner*—Constantine Hannaher
*Assistant Examiner*—Jacob M. Eisenberg
*Attorney, Agent, or Firm*—Edward Schwarz

[57] ABSTRACT

Empty component locations are detected on an assembled circuit board where the component locations are marked with spots of a fluorescent substance before assembly. The circuit board is exposed to stimulating radiation by a radiation source causing luminescence from the spots of fluorescent substance on which the stimulating radiation is impinged. The circuit board is then examined for the luminescence to determine whether the components are between the spots and the radiation source.

8 Claims, 1 Drawing Sheet

METHOD FOR DETECTING MISSING CIRCUIT BOARD COMPONENTS

BACKGROUND OF THE INVENTION

1. Field of the Invention

This invention relates to a method for detecting empty component locations on a circuit board. More particularly, this invention relates to visual inspection of circuit boards for empty component locations.

2. Description of the Prior Art

Miniaturized electronic components are widely used in the electronics industry. These components are often mounted to the surface of a printed circuit board. Since miniaturized electronic components are sometimes very small, it is very difficult to determine whether the components are properly assembled on the circuit board or whether any of the components are missing.

Several methods have been used to detect missing components. One method is electronic visual inspection which is described in the Suzuki et al U.S. Pat. No. 4,549,206. In that method, the presence or absence of a component is ultimately detected by a microprocessor. A multiplicity of light beams are impinged on the circuit board and, due to the reflective properties of the component, the microprocessor discriminates between the presence and absence of a component. Electronic visual inspection such as this can be very accurate but also very expensive to obtain and maintain.

Another method for detecting the presence or absence of a component involves taking electronic measurements between nodes on a circuit board. This method has limited effectiveness when certain combinations of parallel circuits are encountered.

A third method for detecting missing components requires energization of the circuit on the circuit board. The circuit is then monitored to see if it functions properly. This method can effectively detect missing components that are critical to the circuit board's function. However, it may not detect missing components that are active when abnormal things occur in the circuit such as current surges, voltage spikes, or electromagnetic interference.

Finally, human visual inspection has been used to detect missing components. However, since some components are very small, this method can require much labor and be inefficient and unreliable, particularly as the inspector's eyes become tired.

SUMMARY OF THE INVENTION

The present invention is a simple, low cost, and very accurate method for detecting missing components.

Empty component locations are detected on an assembled circuit board where component locations have been marked with spots of a fluorescent substance prior to assembly. The circuit board is exposed to stimulating radiation by a radiation source causing luminescence from the spots of fluorescent substance on which the stimulating radiation is impinged. The circuit board is then examined for the luminescence to determine whether the components are between the spots and the radiation source.

DETAILED DESCRIPTION OF THE PREFERRED EMBODIMENTS

Figure 1:
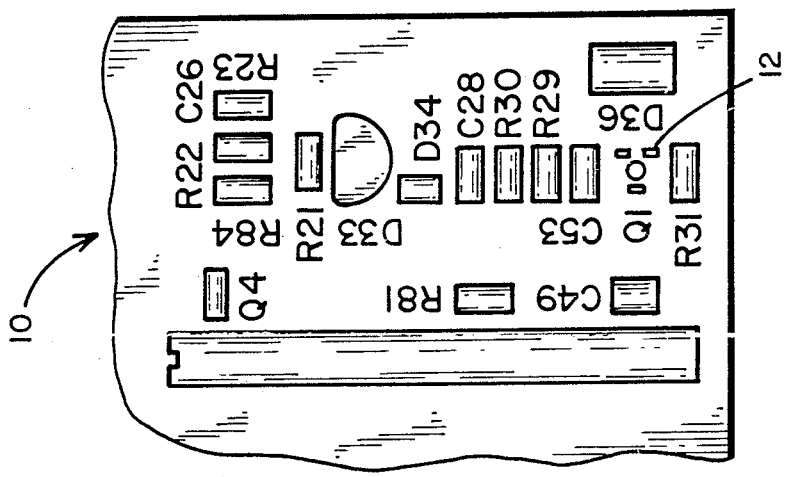
FIG. 1 is an enlarged drawing of a portion of a circuit board with a missing component as seen by an inspector under normal light.

FIG. 1 shows a portion of circuit board 10 with various components assembled on it. All of the components on circuit board 10 are present and in the proper location except transistor Q1 which is missing. Under normal light, as shown in FIG. 1, it is very difficult for a human inspector to determine that transistor Q1 is not present and that component location 12 is empty.

Failure of the inspector to detect that component location 12 is empty could lead to a malfunction of the circuit on circuit board 10. Either a trouble shooting technique or another inspection would be required to detect that component location 12 is empty. This is unnecessarily costly and time consuming, and would be avoided if the inspector could detect that component location 12 was empty during an initial visual inspection.

Component location 12, according to the present invention, is marked with a fluorescent substance. In one preferred embodiment of the present invention, fluorescent paint is painted on all component locations, including component location 12, prior to assembly of circuit board 10.

Figure 2:
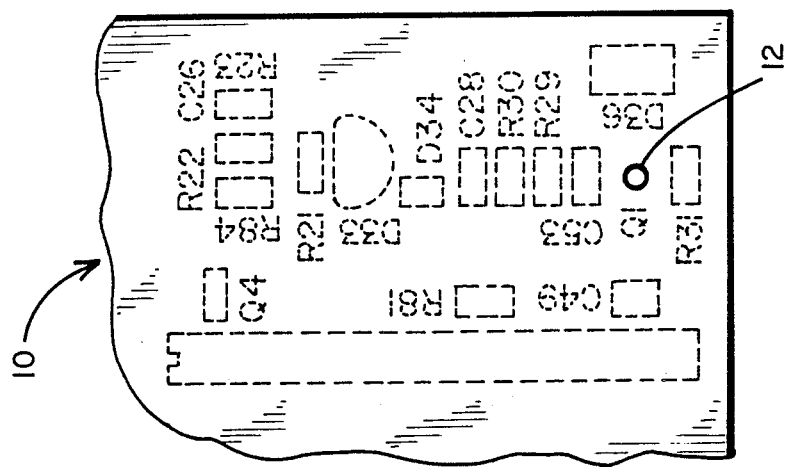
FIG. 2 is the portion of the circuit board in FIG. 1 as seen by an inspector under diminished normal light but with "black" (UV) light added.

FIG. 2 shows circuit board 10 as seen by the visual inspector under reduced normal light. Circuit board 10, in FIG. 2, is also exposed to stimulating radiation such as "black" light or radiation from an ultraviolet source. Since normal light is reduced, the components which are present on circuit board 10 fade and become more difficult to see. Also, the components which are present on circuit board 10 are substantially between the source of stimulating radiation and the marks of fluorescent paint. Therefore the fluorescent paint marking the component locations of the components which are present on circuit board 10 is covered by the components occupying those component locations. Hence, the stimulating radiation, or black light, does not cause any substantial luminescence of the fluorescent markings of the component locations which contain components.

However, since transistor Q1 is absent, the fluorescent material marking component location 12 is exposed to the stimulating radiation. This causes luminescence from the fluorescent material marking component location 12 and that luminescence can be easily visually detected by the inspector. Similarly, if any other components were missing from circuit board 10, the inspector would see fluorescent markings similar to that marking component location 12 for each missing component.

The fluorescent substance used to mark the component locations and the stimulating radiation should be chosen such that there is substantial luminescence from the fluorescent substance caused when the fluorescent substance is exposed to the stimulating radiation. If greater luminescence is caused, the fluorescent material marking the component locations of missing components will appear brighter to the inspector when exposed to the stimulating radiation. Therefore, the inspector will more easily be able to detect missing components.

The present invention is a very simple, low cost, accurate and reliable method for detecting missing components on a circuit board. It is simple to implement into conventional circuit board construction and it has substantially no maintenance costs.

Although the present invention has been described with reference to preferred embodiments, workers skilled in the art will recognize that changes may be made in form and detail without departing from the spirit and scope of the invention.

What is claimed is:

1. A method for detecting empty component locations on an assembled circuit board, where the component locations are marked with spots of a fluorescent substance before assembly, the method comprising the steps of:
    exposing the circuit board to stimulating radiation which is emitted by a radiation source causing luminescence from the spots of fluorescent substance on which the stimulating radiation is impinged; and
    examining the circuit board for the luminescence to determine whether the components are between the spots and the radiation source.

2. The method of claim 1 wherein the exposing and examining steps are performed in an environment having reduced visible illumination compared to visible illumination during assembly.

3. A method for detecting empty component locations on a circuit board where the component locations are marked with spots of a fluorescent substance, comprising the steps of:
    assembling components on the circuit board in the component locations;
    exposing the circuit board to stimulating radiation which is emitted by a radiation source causing luminescence from the spots of fluorescent substance on which the stimulating radiation is impinged; and
    examining the circuit board for luminescence to determine whether the components are between the spots and the radiation source.

4. The method of claim 3 wherein the exposing and examining steps are performed in an environment having a lower level of visible illumination than is present during the assembly step.

5. A method for detecting empty component locations on a circuit board, comprising the steps of:
    marking the component locations with a spot of a fluorescent substance prior to assembly;
    assembling components on the circuit board in component locations;
    exposing the circuit board to stimulating radiation which is emitted by a radiation source causing luminescence from the spots of fluorescent substance on which the stimulating radiation is impinged; and
    examining the circuit board for the luminescence to determine whether the components are between the spots and the radiation source.

6. The method of claim 5 wherein the exposing and examining steps are performed in an environment having a lower level of visible illumination than is present during the assembly step.

7. A method for detecting empty component locations on an assembled circuit board, where the component locations are marked with spots of a fluorescent substance before assembly, the method comprising the steps of:
    exposing the circuit board to stimulating radiation which is emitted by a radiation source causing luminescence from the spots of fluorescent substance on which the stimulating radiation is impinged; and
    sensing the luminescence to determine whether the components are between the spots and the radiation source.

8. The method of claim 7 wherein sensing the luminescence is through human visual inspection to determine whether the components are between the spots and the radiation source.

* * * * *